United States Patent
Malone et al.

(10) Patent No.: US 8,720,532 B2
(45) Date of Patent: May 13, 2014

(54) CONTROLLABLE FLOW RESISTANCE IN A COOLING APPARATUS

(75) Inventors: Christopher G. Malone, Loomis, CA (US); Glenn C. Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1525 days.

(21) Appl. No.: 10/836,665

(22) Filed: Apr. 29, 2004

(65) Prior Publication Data

US 2005/0241810 A1    Nov. 3, 2005

(51) Int. Cl.
*H05K 7/20*    (2006.01)

(52) U.S. Cl.
USPC ............................ 165/121; 361/695; 454/184

(58) Field of Classification Search
USPC .............. 165/80.3, 121, 122, 104.33, 104.34; 361/687, 688, 690, 695–697; 454/184
See application file for complete search history.

(56) References Cited

U.S. PATENT DOCUMENTS

| | | | | |
|---|---|---|---|---|
| 5,102,040 A | * | 4/1992 | Harvey | 361/695 |
| 5,107,398 A | * | 4/1992 | Bailey | 361/695 |
| 5,249,741 A | * | 10/1993 | Bistline et al. | 165/80.3 |
| 5,287,244 A | * | 2/1994 | Hileman et al. | 361/697 |
| 5,297,005 A | * | 3/1994 | Gourdine | 361/697 |
| 5,410,448 A | | 4/1995 | Barker, III et al. | |
| 5,484,012 A | * | 1/1996 | Hiratsuka | 361/695 |
| 5,491,610 A | * | 2/1996 | Mok et al. | 361/695 |
| 5,894,987 A | * | 4/1999 | Layne et al. | 165/80.3 |
| 5,940,266 A | | 8/1999 | Hamilton et al. | |
| 6,072,397 A | * | 6/2000 | Ostrowski | 454/257 |
| 6,108,203 A | | 8/2000 | Dittus et al. | |
| 6,181,557 B1 | * | 1/2001 | Gatti | 361/695 |
| 6,280,317 B1 | | 8/2001 | Przilas et al. | |
| 6,330,155 B1 | | 12/2001 | Remsburg | |
| 6,341,064 B1 | | 1/2002 | Bradley | |
| 6,397,933 B1 | | 6/2002 | Enlund | |
| 6,502,628 B1 | * | 1/2003 | Siahpolo et al. | 165/122 |
| 6,587,340 B2 | * | 7/2003 | Grouell et al. | 361/695 |
| 6,625,018 B1 | | 9/2003 | Augustin et al. | |
| 6,657,861 B2 | * | 12/2003 | Irmer | 361/695 |
| 6,688,965 B1 | * | 2/2004 | Crippen et al. | 454/184 |
| 6,702,665 B1 | * | 3/2004 | Tai | 454/256 |
| 6,957,544 B2 | * | 10/2005 | Dobbs et al. | 165/80.3 |
| 7,038,910 B1 | * | 5/2006 | Hodge et al. | 361/690 |
| 2002/0145853 A1 | * | 10/2002 | Grouell et al. | 361/695 |

* cited by examiner

*Primary Examiner* — Leonard R Leo

(57) ABSTRACT

An airflow control apparatus includes a controllable airflow resistance aligned with an airflow path of a plurality of airflow paths, a sensor capable of detecting an airflow condition in at least one of the plurality of airflow paths, and a controller. The controller is coupled to the controllable airflow resistance and to the sensor, and can control the controllable airflow resistance to manage airflow recirculation based on the airflow condition detected by the sensor.

24 Claims, 8 Drawing Sheets

CONTROLLABLE FLOW RESISTANCE IN A COOLING APPARATUS

BACKGROUND OF THE INVENTION

Electronic systems and equipment such as computer systems, network interfaces, storage systems, and telecommunications equipment are commonly enclosed within a chassis, cabinet or housing for support, physical security, and efficient usage of space. Electronic equipment contained within the enclosure generates a significant amount of heat. Thermal damage may occur to the electronic equipment unless the heat is removed.

Re-circulation of heated air can impact performance of electronic equipment. If airflow patterns allow re-usage of air that is previously heated by electronic equipment component to attempt to cool electronic equipment, less effective heat transfer from the equipment to the cooling airflow can result. In some circumstances insufficient heat transfer can take place and the equipment may overheat and potentially sustain thermal damage.

One re-circulation scenario occurs when a fan fails and hot air exhausted from other vents in the system may re-circulate back to the vicinity of the failed fan, greatly impacting thermal management for device.

SUMMARY

In accordance with an embodiment of a cooling system, an airflow control apparatus includes a controllable airflow resistance aligned with an airflow path of a plurality of airflow paths, a sensor capable of detecting an airflow condition in at least one of the plurality of airflow paths, and a controller. The controller is coupled to the controllable airflow resistance and to the sensor, and can control the controllable airflow resistance to manage airflow recirculation based on the airflow condition detected by the sensor.

BRIEF DESCRIPTION OF THE DRAWINGS

Embodiments of the invention relating to both structure and method of operation, may best be understood by referring to the following description and accompanying drawings.

DETAILED DESCRIPTION

Figure 1:
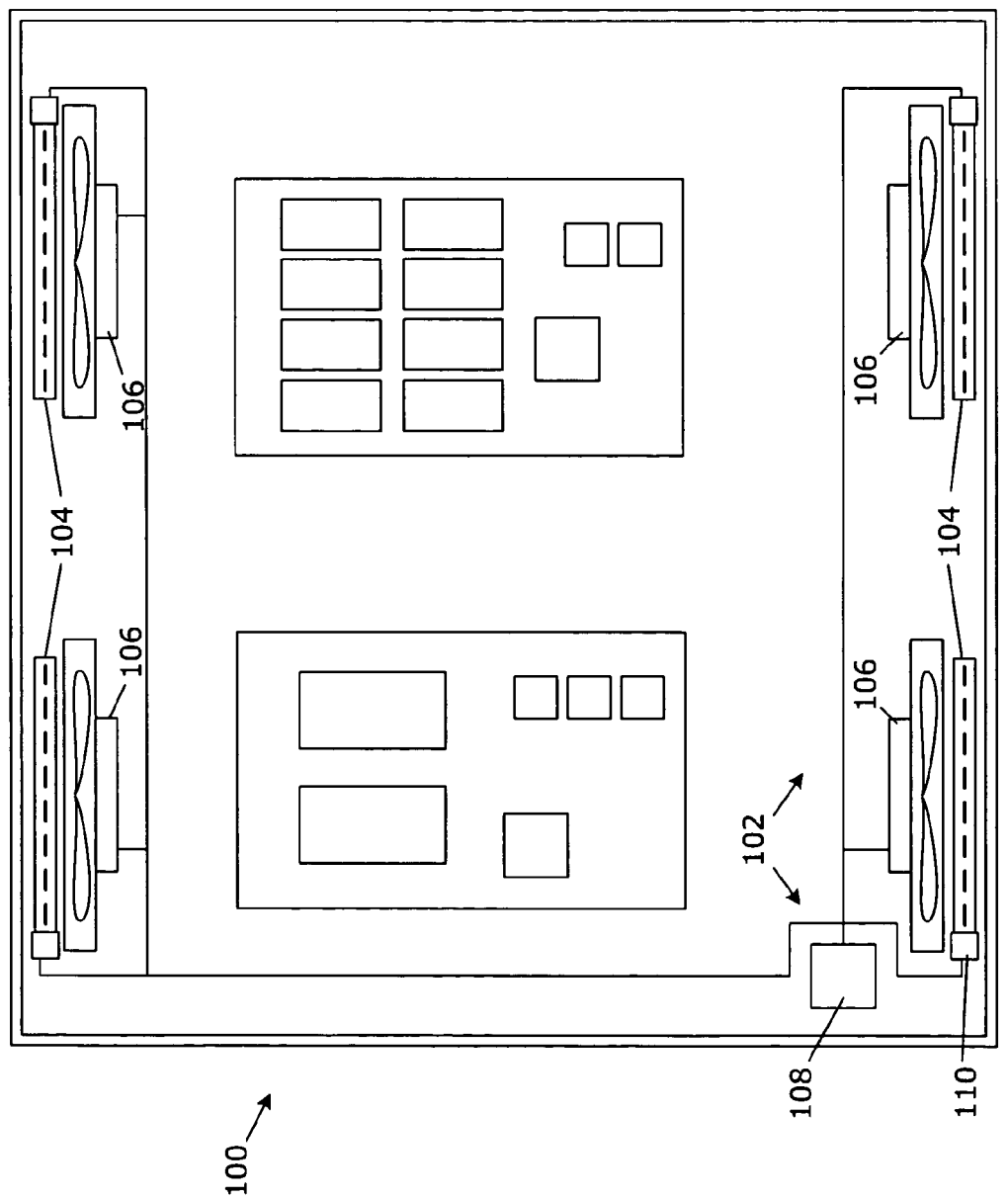
FIG. 1 is a schematic pictorial and block diagram illustrating an overhead view of and embodiment of a cooling system that includes an airflow control apparatus.

Referring to FIG. 1, a schematic pictorial and block diagram illustrates an overhead view of and embodiment of a cooling system 100 that includes an airflow control apparatus 102. The airflow control apparatus 102 further includes a controllable airflow resistance 104 aligned with an airflow path of a plurality of airflow paths, a sensor 106 capable of detecting an airflow condition in at least one of the plurality of airflow paths, and a controller 108. The controller 108 is coupled to the controllable airflow resistance 104 and to the sensor 106, and can control the controllable airflow resistance 104 to manage airflow recirculation based on the airflow condition detected by the sensor 106.

In various embodiments, the controllable airflow resistance 104 can be implemented as controllable louvers, sliding plates with variable perforations, variable sized vents or apertures, a perforated wall with associated sliding plates, shutters, and the like.

In some embodiments, the controllable airflow resistance 104 is associated and coupled to a servo motor 110 with the controller 108 being coupled to the servo motor 110 to supply the servo motor with signals for controlling the servo motor to selectively modify the controllable airflow resistance.

The airflow control apparatus 102 may further include a fan 112 coupled into an airflow path of the multiple airflow paths and coupled to the controller 108. The controller 108 can control operations of the fan 112 in conjunction with the controllable airflow resistance 104.

A typical airflow control apparatus 102 may include multiple sensors 106, multiple controllable airflow resistances 104, and multiple fans 112. The controller 108 receives signals from multiple sensors 106 and detects airflow recirculation conditions based on the signals and responds to correct or improve the conditions. For example, the controller 108 can include a logic that reduces fan speed and increases associated airflow resistance in response to a recirculation condition.

Figure 2:
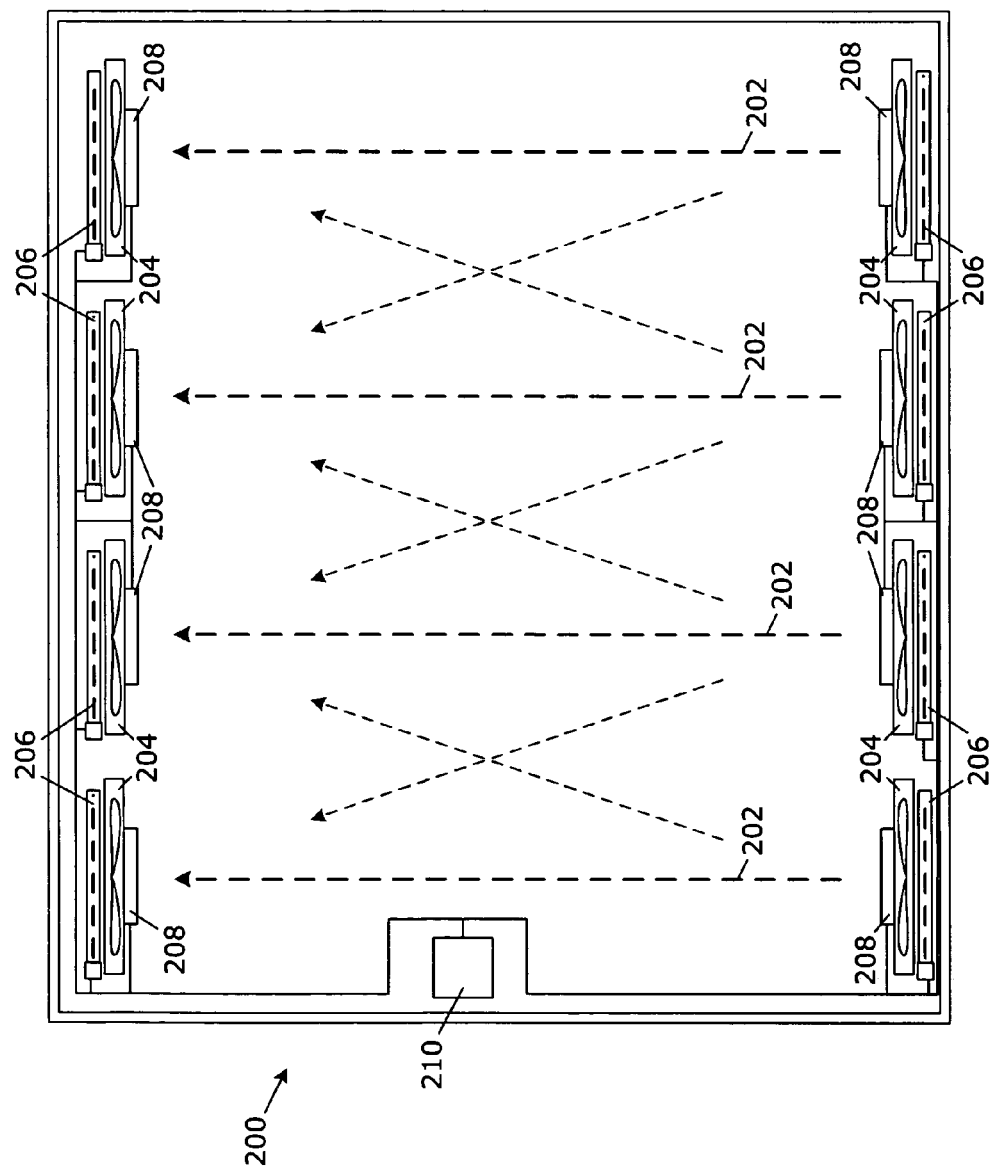
FIG. 2 is a schematic pictorial and block diagram showing an embodiment of a cooling apparatus that uses controllable airflow resistances to manage airflow.

Referring to FIG. 2, a schematic pictorial and block diagram illustrates an embodiment of a cooling apparatus 200 that uses controllable airflow resistances to manage airflow. The cooling apparatus 200 includes a plurality of at least partly intersecting airflow pathways 202. The individual airway pathways 202 further include one or more fans 204, one or more controllable airflow resistances 206 associated with the fans 204, and one or more sensors 208 that can detect an airflow condition in one or more of the pathways 202. The cooling apparatus 200 further includes a controller 210 coupled to the controllable airflow resistances 206 and the sensors 208 that can control the airflow resistances 206 based on the airflow condition.

The cooling apparatus 200 may include a process executable on the controller 210 that detects failure of a fan 204 and responds to fan failure detection by selectively controlling the controllable airflow resistances 206 in the airflow pathways 202. For example, if one or more of the fans 204 in the airflow pathways 202 have a controllable fan speed, the cooling apparatus 200 may include a process executable on the controller 210 that detects failure of a fan and responds by selectively controlling fan speed in the operative and controllable fans in conjunction with management of the controllable airflow resistances 206.

Figure 3:
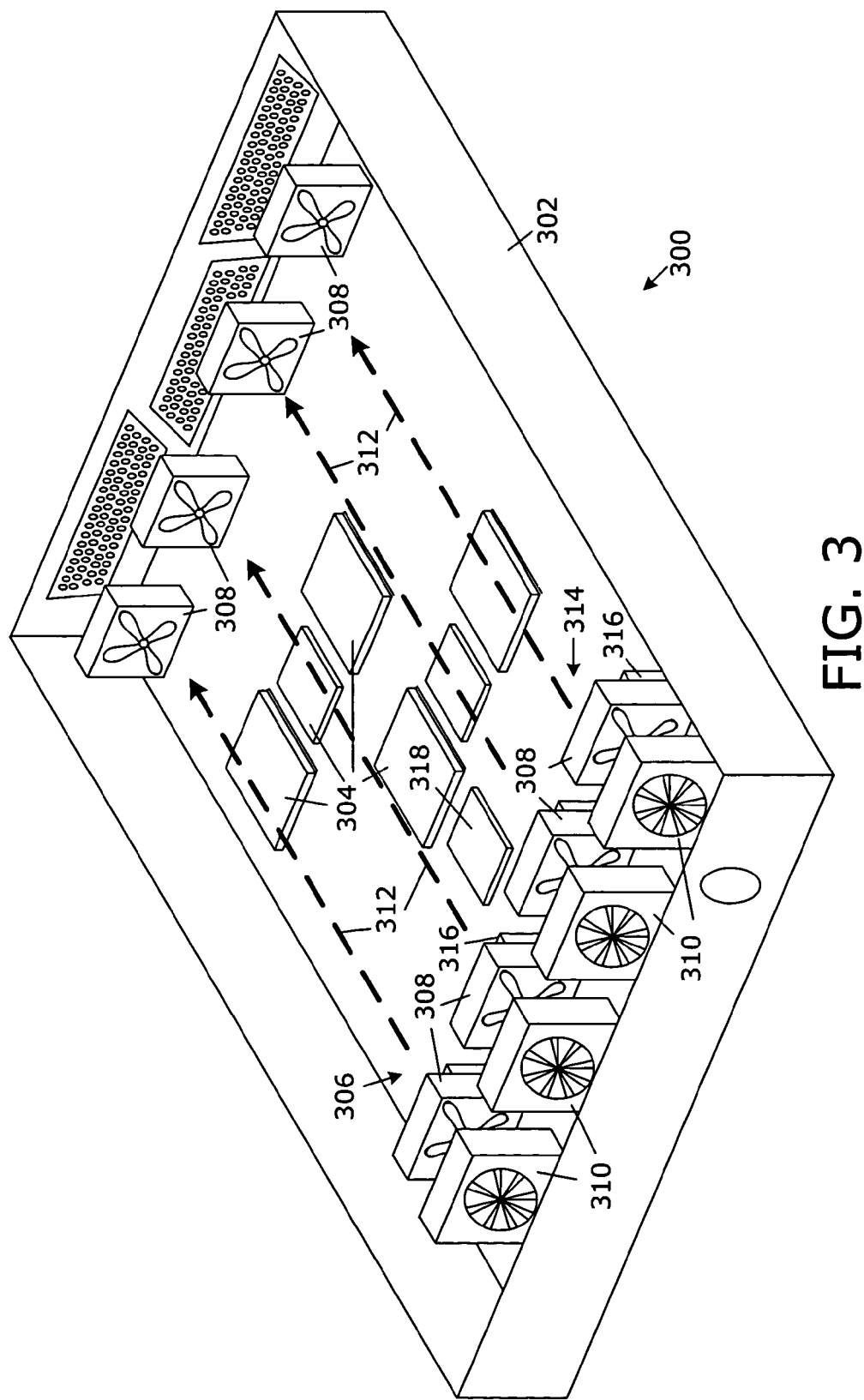
FIGS. 3 and 4 are perspective pictorial diagrams that illustrate alternative embodiments of electronic systems that use controllable flow resistance to manage airflow.

Referring to FIG. 3, a perspective pictorial diagram illustrates an embodiment of an electronic system 300 that uses controllable flow resistance to manage airflow. The electronic system 300 includes a chassis 302, multiple components 304 including heat-generating components mounted within the chassis 302, and an air cooling system 306. The air cooling system 306 includes multiple fans 308 and associated controllable airflow resistances 310 forming a plurality of at least partly intersecting airflow pathways 312. The electronic system 300 further includes an airflow control system 314 coupled to the air cooling system 306 that can detect airflow conditions in the airflow pathways 312 and controls the airflow resistances 310 based on the airflow condition.

The individual airway pathways 312 typically include at least one fan 308 and at least one controllable airflow resistance 310 associated with the fan 308.

The airflow control system may also include at least one sensor 316 that enables detection of an airflow condition in at least one of the airflow pathways 312, and a controller 318. The controller 318 communicates with the controllable airflow resistances 310 and the sensors 316, and controls the airflow resistances 310 based on the airflow condition. Generally, in response to detection of an abnormal or undesirable airflow condition, the airflow control system 314 modifies the airflow resistances 310 to improve the airflow condition. Airflow conditions are determined by sensing various parameters. For example, the controller 318 can detect failure of a fan and respond by controlling resistance. In another example, airflow may be directly monitored in the pathways 312 using various types of flow, force, or pressure sensors. In other embodiments, systems, or conditions, a tachometer may be used to directly sense functionality of the fans 308. In some embodiments, the airflow control system 314 can be configured to selectively control fan speed among the multiple fans 308 in combination with controlling the airflow resistances based on the airflow condition.

Figure 4:
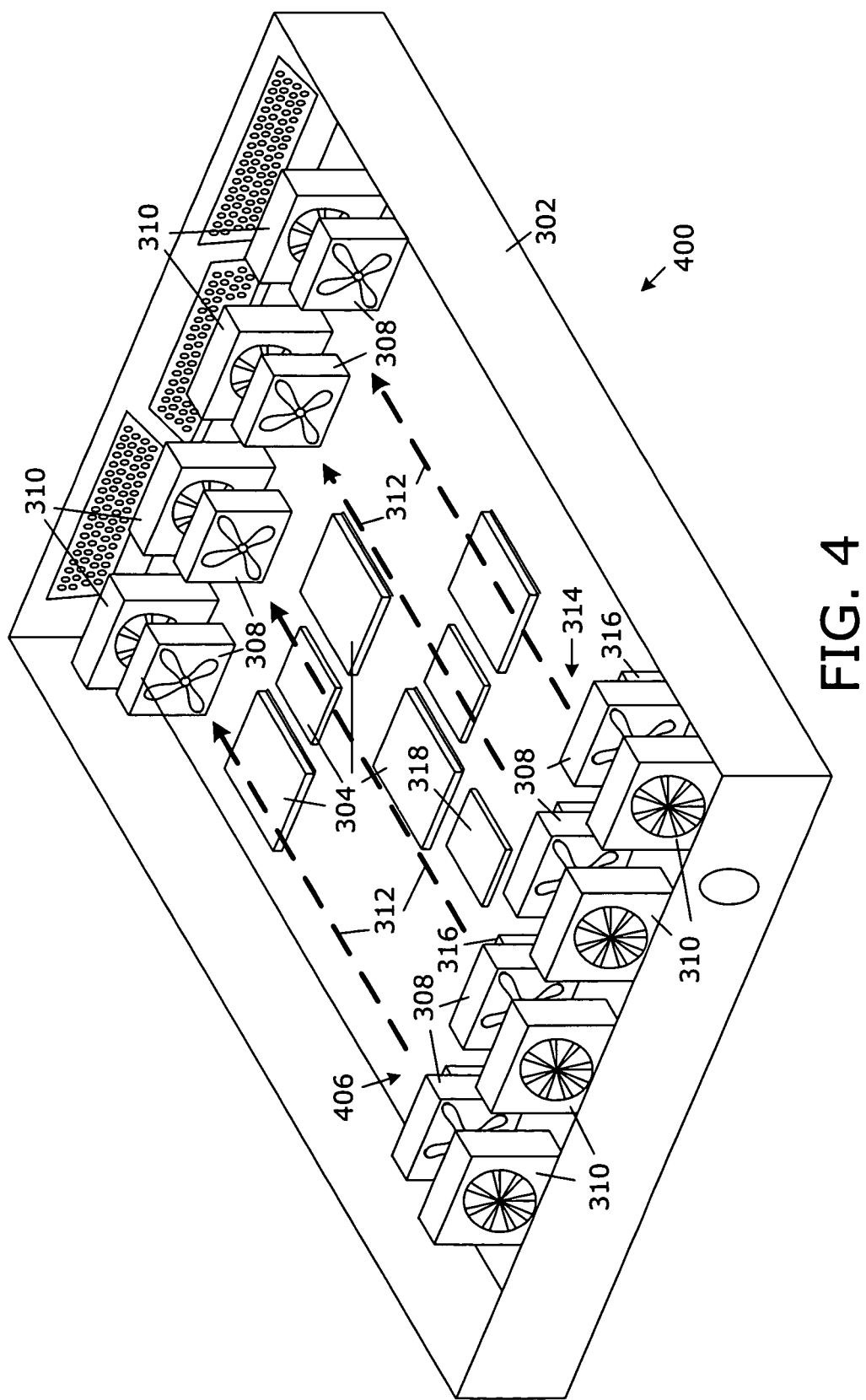

FIG. 3 depicts an embodiment of a cooling system 306 that uses controllable airflow resistances 310 only on the inlet duct size of the electronic system 300. In an alternative embodiment shown in FIG. 4, a cooling system 406 includes controllable airflow resistances 310 on both airflow inlet and outlet sides of an electronic system 400.

Electronic systems 300 and 400 both have controllable flow resistance modules 310 in the form of separate modules that can be positioned adjacent to a fan 308.

Figure 5B:
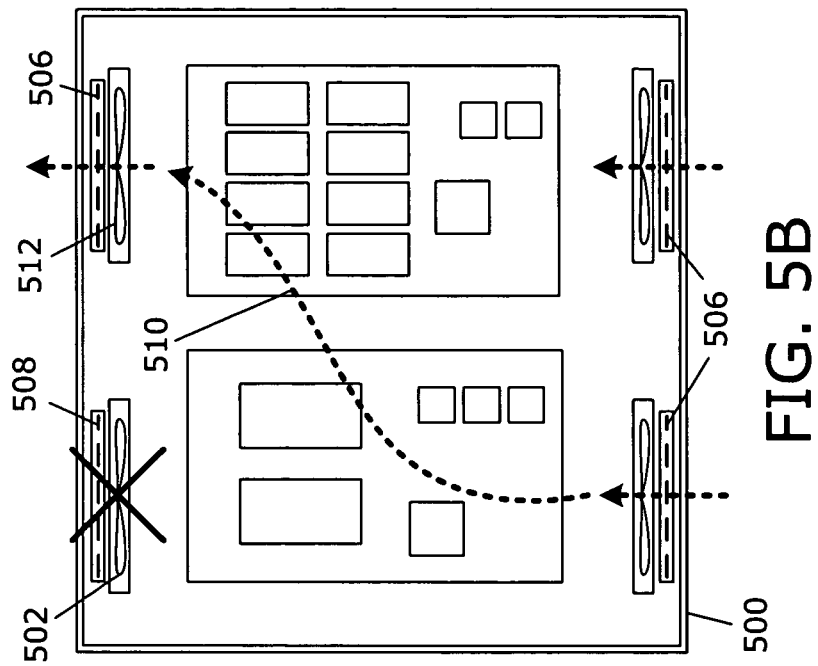
FIGS. 5A and 5B are schematic pictorial diagrams that illustrate airflow in an electronic system in the event of fan failure.
Figure 5A:
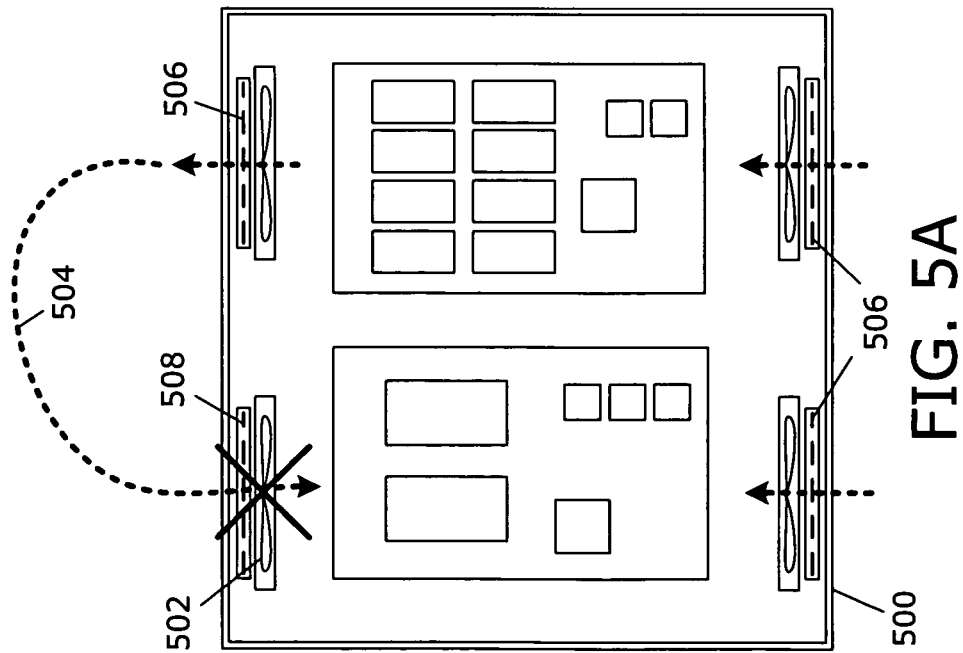

Referring to FIGS. 5A and 5B, two schematic pictorial diagrams illustrate airflow in an electronic system 500 such as a computer server. As shown in FIG. 5A, a failed fan 502 creates potential for recirculation 504 of cooling airflow in electronic systems. Configuring a system with variable and controllable flow resistance 506 at the fan entrance or exit can eliminate or reduce a recirculation condition. When all fans are operating properly, flow resistance can be set to a minimum value. When an airflow controller, for example implemented in fan control firmware, detects failure of a fan, the controller can adjust the controllable flow resistance 508 associated with the failed fan 502 to a higher value, for example an infinite value by closing the appropriate controllable flow resistance. Adjustment of the controllable flow resistance 508 diverts flow 510 through the system 500 through a properly functioning fan 512 as shown in FIG. 5B. The modified controllable flow resistance 508 can be modified to a value sufficient to eliminate recirculation. Typically the modified flow resistance is less than infinity to permit some air to be driven through the failed fan 502 by the functional system fans and drawing air from multiple inflow fans over electronic components that are otherwise predominantly cooled by the failed fan 502.

Poor cooling performance due to fan failure and concomitant flow recirculation can be reduced or eliminated through the illustrative controllable cooling system.

The controllable flow resistance may be implemented using a variety of techniques. For example, controllable louvers or sliding plates with variable perforation can be implemented. Flow resistance control may be implemented by modulating the louver or plate position using servomotors controlled by system firmware. The controllable flow resistance element may be integrated into the electronic system chassis or housing or as part of a fan field replaceable unit.

The concept may be extended to systems configured with a minimum number of cooling fans and less-than-fully-configured systems. For example, some customers may purchase systems designed with redundant cooling without including particular redundant fans so that initial hardware costs are reduced. An unloaded fan position may create an air recirculation or bypass path, which is typically addressed by adding a flow block. An in-chassis controllable airflow resistance associated with the unloaded fan can be adjusted to prevent recirculation or bypass automatically. Systems configured with unloaded memory, processors, input/output devices, and power supply unit slots create airflow bypasses or other undesirable flow patterns. By reducing fan speed and increasing associated fan airflow resistance for fans dedicated to cooling the unloaded components, the problem is eliminated. Appropriate control operation involves integration between the fan control firmware and firmware which senses system configuration.

A method for managing airflow in a ventilation system in an electronic system may include actions of monitoring airflow conditions in a plurality of airflow pathways and detecting a malfunction condition of the monitored airflow conditions. The method further includes adjusting an airflow resistance in at least one airflow pathway in response to the detected malfunction condition.

The action of monitoring airflow conditions may include monitoring for detection of a fan failure malfunction condition and/or for detection of an unloaded condition of a fan. The adjustment may include simply appropriately modifying the airflow resistance or more complex control operations. For example, the fan speed for one or more of the fans associated with the multiple airflow pathways may be controlled in combination with adjustment of the airflow resistance in response to a particular detected condition.

Figure 6:
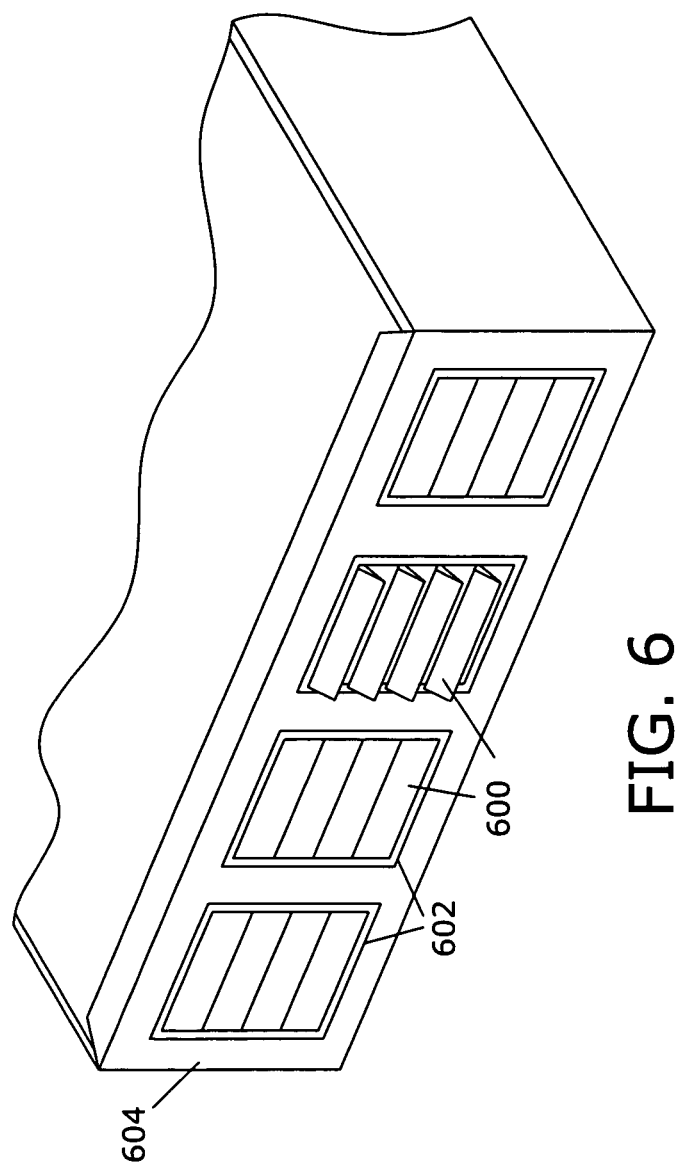
FIG. 6 is a perspective pictorial diagram showing an embodiment of a cooling assembly including a controllable flow resistance integrated into a housing or chassis.

In alternative embodiments, a controllable flow resistance 600 can be in the form of an assembly 602 integrated into a housing or chassis 604 as shown in FIG. 6. The controllable flow resistance 600 includes multiple shutters 606.

Figure 7:
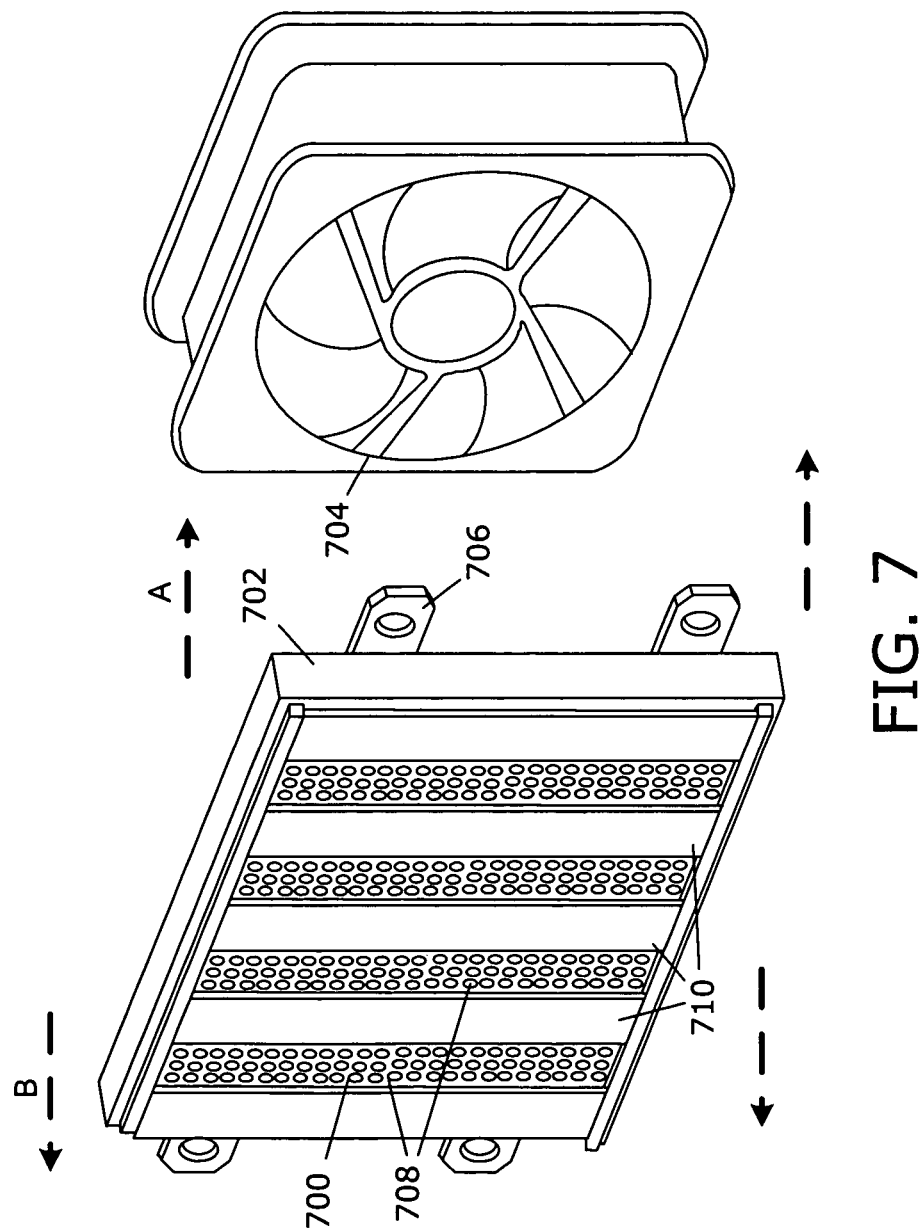
FIG. 7 is a perspective pictorial diagram showing an embodiment of a cooling assembly including a controllable flow resistance that can be attached to a chassis or a fan.

In still other embodiments, a controllable flow resistance 700, shown in FIG. 7, can be configured as an assembly 702 that is: (A) attachable to a fan 704 or (B) attachable to a housing or chassis, for example using attachment hardware 706. The illustrative controllable flow resistance 700 includes a perforated wall 708 with associated sliding plates 710.

Figure 8:
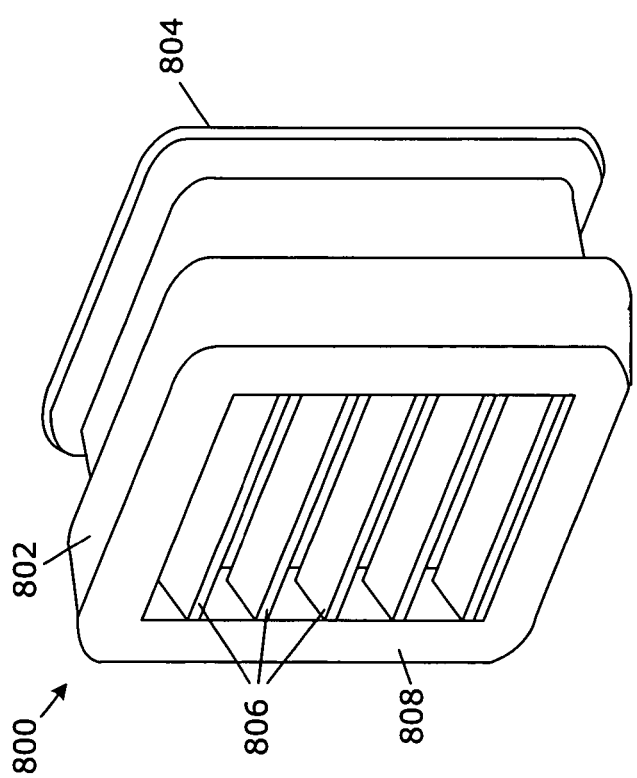
FIG. 8 is a perspective pictorial diagram showing an embodiment of a cooling assembly including a controllable flow resistance integrated with a fan.

Another configuration of a cooling assembly 800 is shown in FIG. 8 and includes a controllable flow resistance 802 integrated with a fan 804. The controllable flow resistance 802 includes controllable louvers 806 that are flush mounted to a wall 808 of the assembly 800. The cooling assembly 800 can be used in an electronics system and further includes the controllable airflow resistance 802 and the fan 804 integrated with the controllable flow resistance 802 to form a unitary assembly 800.

A controllable flow resistance may take other forms, for example sliding plates with perforations of like size or variable size, variable sized vents or apertures, sliding plates that fan out from an axial point, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, although particular configurations of flow resistance assemblies are shown, other arrangements are possible including additional geometries and sizes. Also, particular electronic system embodiments are illustrated, for example a computer server. In other embodiments, the cooling assemblies with controllable flow resistance can be employed in other types of electronic systems such as communication systems, storage systems, entertainment systems, and the like.

What is claimed is:

1. An airflow control apparatus comprising:
a controllable airflow resistance aligned with an airflow path of a plurality of airflow paths;
a sensor that detects an airflow condition in at least one of the plurality of airflow paths;
a controllable-speed fan coupled into an airflow path of the plurality of airflow paths;
a controller coupled to the controllable airflow resistance and the sensor, the controller comprising a logic that controls the controllable airflow resistance in combination with the controllable-speed fan to manage airflow recirculation based on the airflow condition detected by the sensor;
a plurality of controllable airflow resistances; and
a plurality of fans coupled into multiple airflow pathways, the controller controllably coupled to the plurality of controllable airflow resistances and to the plurality of fans, and comprising a logic that determines an airflow recirculation condition based on the airflow condition and adjusts the controllable airflow resistances and the controlled-speed fans in combination, wherein the logic detects a recirculation condition and responds to the detected recirculation by reducing fan speed in at least one selected fan and increasing a selected airflow resistance.

2. The apparatus according to claim 1 wherein:
the controllable airflow resistance is selected from a group consisting of: controllable louvers, sliding plates with variable perforations, variable sized vents or apertures, a perforated wall with associated sliding plates, and shutters; and
the controllable flow resistance is configured in a form selected from a group consisting of: an assembly integrated into a chassis or housing, an assembly attachable to a chassis or housing, a separate assembly that can be positioned adjacent to a fan, an assembly integrated with a fan, and an assembly attachable to a fan.

3. The apparatus according to claim 1 further comprising:
a servo motor associated with and coupled to the controllable airflow resistance, the controller being coupled to the servo motor to supply the servo motor with signals controlling the servo motor to selectively modify the controllable airflow resistance.

4. The apparatus according to claim 1 wherein:
the controller regulates the controllable airflow resistance to a value sufficient to eliminate recirculation and less than infinity to enable some air to be driven through a failed fan in a multiple-fan configuration by functional fans drawing air in an airflow pathway that is otherwise driven by the failed fan.

5. The apparatus according to claim 1 wherein:
the controller includes a logic that detects fan failure and responds by controlling fan speed in selected fans in the fan plurality and controlling resistance in selected airflow resistances in the controllable airflow resistance plurality.

6. The apparatus according to claim 1 wherein:
the controller includes firmware that detects a configuration of occupied and unoccupied component slots in the plurality of airflow paths and responds by controlling fan speed in selected fans in the fan plurality and controlling resistance in selected airflow resistances in the controllable airflow resistance plurality according to the configuration.

7. A cooling apparatus comprising:
a plurality of at least partly intersecting airflow pathways, the individual airway pathways further comprising:
at least one fan comprising at least one controllable-speed fan; and
at least one controllable airflow resistance associated with the at least one fan;
at least one sensor that monitor airflow in at least one of the plurality of airflow paths;
a controller coupled to the at least one controllable airflow resistance, the at least one sensor, and the at least one fan, and that controls the controllable airflow resistances and the at least one controllable-speed fan in combination based on the monitored airflow; and
firmware executable on the controller that detects a configuration of occupied and unoccupied component slots in the plurality of airflow paths and responds by controlling fan speed in selected controllable-speed fans of the at least one fan in conjunction with controlling resistance in selected airflow resistances in the controllable airflow resistance plurality according to the configuration, wherein the firmware detects a recirculation condition and responds to the detected recirculation by reducing fan speed in at least one selected fan and increasing a selected airflow resistance.

8. The apparatus according to claim 7 further comprising:
a process executable on the controller that detects failure of a fan and respond to the fan failure detection by selectively controlling the controllable airflow resistances in the airflow pathways and fan speed of a non-failing fan of the at least one controllable-speed fan in combination.

9. The apparatus according to claim 7 further comprising:
a plurality of fans in the airflow pathways comprising at least one controllable-speed fan having a controllable fan speed; and
a process executable on the controller that detects failure of a fan of the fan plurality and responds to the fan failure detection by selectively controlling the controllable airflow resistances in the airflow pathways and fan speed of zero or more non-failing controllable-speed fans in combination.

10. The apparatus according to claim 7 wherein:
the controllable airflow resistances are selected from a group consisting of: controllable louvers, sliding plates with variable perforations, variable sized vents or apertures, a perforated wall with associated sliding plates, and shutters; and
the controllable flow resistances are configured in a form selected from a group consisting of: an assembly integrated into a chassis or housing, an assembly attachable to a chassis or housing, a separate assembly that can be positioned adjacent to a fan, an assembly integrated with a fan, and an assembly attachable to a fan.

11. The apparatus according to claim 7 further comprising:
at least one servo motor associated with and coupled to ones of the controllable airflow resistances, the controller being coupled to the servo motor to supply the servo motor with signals controlling the servo motor to selectively modify the controllable airflow resistance.

12. The apparatus according to claim 7 further comprising:
a process executable on the controller that detects fan failure and responds by controlling fan speed in selected ones of the controllable-speed fans and controlling resistance in selected airflow resistances in the controllable airflow resistance plurality.

13. An electronic system comprising:
a chassis;
a plurality of components including heat-generating components mounted within the chassis;
an air cooling system comprising a plurality of fans and associated controllable airflow resistances forming a plurality of at least partly intersecting airflow pathways; and
an airflow control system coupled to the air cooling system and that monitors airflow in the airflow pathways and controls the airflow resistances based on the monitored airflow, wherein:
the airflow control system controls fan speed selectively among the plurality of fans in combination with controlling the airflow resistances based on the airflow condition to reduce fan speed and increase airflow resistance in response to a recirculation condition; and
the airflow control system includes firmware that controls fan speed selectively among the plurality of fans in combination including detecting a configuration of occupied and unoccupied component slots in the plurality of airflow paths and responding by controlling fan speed in selected fans in the fan plurality in conjunction with controlling resistance in selected airflow resistances in the controllable airflow resistance plurality according to the configuration, wherein the firmware detects a recirculation condition and responds to the detected recirculation by reducing fan speed in at least one selected fan and increasing a selected airflow resistance.

14. The electronic system according to claim 13 wherein:
the airflow control system controls fan speed selectively among the plurality of fans in combination including detecting fan failure and responding by controlling fan speed in selected fans in the fan plurality and controlling resistance in selected airflow resistances in the controllable airflow resistance plurality.

15. The electronic system according to claim 13 wherein individual airway pathways further comprise:
at least one controllable-speed fan; and
at least one controllable airflow resistance associated with the at least one controllable-speed fan.

16. The electronic system according to claim 13 wherein the airflow control system further comprises:
at least one sensor that monitor airflow in at least one of the plurality of airflow paths; and
a controller coupled to the controllable airflow resistances and coupled to the at least one sensor, and that controls the controllable airflow resistances based on the monitored airflow.

17. The electronic system according to claim 13 further comprising:
a process executable on the controller that detects failure of a fan and responds to the fan failure detection by selectively controlling the controllable airflow resistances in the airflow pathways.

18. The electronic system according to claim 13 further comprising:
at least one of the fan in the airflow pathways having a controllable fan speed; and
a process executable on the controller that detects failure of a fan and responds to the fan failure detection by selectively controlling the controllable airflow resistances in the airflow pathways in combination with fan speed.

19. The electronic system according to claim 13 wherein:
the controllable airflow resistances are selected from a group consisting of: controllable louvers, sliding plates with variable perforations, variable sized vents or apertures, a perforated wall with associated sliding plates, and shutters; and
the controllable flow resistances are configured in a form selected from a group consisting of: an assembly integrated into a chassis or housing, an assembly attachable to a chassis or housing, a separate assembly that can be positioned adjacent to a fan, an assembly integrated with a fan, and an assembly attachable to a fan.

20. An apparatus comprising:
a cooling assembly for usage in an electronics system further comprising:
a controllable airflow resistance; and
a controllable-speed fan integrated with the controllable flow resistance to form a unitary assembly, the controllable airflow resistance and controllable-speed fan being adjusted in combination; and
firmware that detects a configuration of occupied and unoccupied component slots in airflow paths in the electronic system and responds by controlling fan speed in the controllable-speed fan in combination with controlling the controllable airflow resistance according to the configuration, wherein:
the firmware detects a recirculation condition and responds to the detected recirculation by reducing fan speed in at least one selected fan and increasing a selected airflow resistance.

21. The electronic system according to claim 20 wherein:
the controllable airflow resistances are selected from a group consisting of: controllable louvers, sliding plates with variable perforations, variable sized vents or apertures, a perforated wall with associated sliding plates, and shutters.

22. A method of managing airflow in a ventilation system comprising:
monitoring airflow in a plurality of airflow pathways;
detecting a malfunction condition on the monitored airflow;
adjusting an airflow resistance to manage airflow recirculation in at least one airflow pathway in response to the detected malfunction condition;
adjusting fan speed of at least one fan associated with the plurality of airflow pathways in combination with adjusting the airflow resistance in response to the detected condition;
detecting a configuration of occupied and unoccupied component slots in the plurality of airflow paths;
responding by controlling fan speed in the at least one fan in combination with controlling airflow resistance in the airflow pathway plurality according to the configuration;

detecting a recirculation condition; and responding to the detected recirculation by reducing fan speed in at least one selected fan and increasing a selected airflow resistance.

23. The method according to claim 22 further comprising:

monitoring airflow conditions for detection of a fan failure malfunction condition and/or for detection of an unloaded condition of a fan.

24. The method according to claim 22 further comprising:

regulating the airflow resistance to a value sufficient to eliminate recirculation and less than infinity to enable some air to be driven through a failed fan in a multiple-fan configuration by functional fans drawing air in an airflow pathway that is otherwise driven by the failed fan.

* * * * *